United States Patent
Xie et al.

(10) Patent No.: US 9,236,258 B2
(45) Date of Patent: Jan. 12, 2016

(54) METHODS OF FORMING GATE STRUCTURES FOR SEMICONDUCTOR DEVICES USING A REPLACEMENT GATE TECHNIQUE AND THE RESULTING DEVICES

(71) Applicant: GLOBALFOUNDRIES Inc., Grand Cayman (KY)

(72) Inventors: Ruilong Xie, Niskayuna, NY (US); Xiuyu Cai, Niskayuna, NY (US); Andy C. Wei, Queensbury, NY (US); Qi Zhang, Mechanicville, NY (US); Ajey Poovannummoottil Jacob, Watervliet, NY (US); Michael Hargrove, Clinton Corners, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/259,694

(22) Filed: Apr. 23, 2014

(65) Prior Publication Data
US 2015/0311081 A1    Oct. 29, 2015

(51) Int. Cl.
*H01L 21/338* (2006.01)
*H01L 21/28* (2006.01)
*H01L 29/51* (2006.01)

(52) U.S. Cl.
CPC .......... *H01L 21/28008* (2013.01); *H01L 29/51* (2013.01)

(58) Field of Classification Search
CPC .................................................. H01L 29/66545
USPC ................... 438/183, 184, 176; 257/E21.158
See application file for complete search history.

(56) References Cited

U.S. PATENT DOCUMENTS 6,054,355 A * 4/2000 Inumiya et al. ............... 438/296
6,383,884 B1 * 5/2002 Shiozawa et al. ............. 438/305

* cited by examiner

*Primary Examiner* — Julia Slutsker
(74) *Attorney, Agent, or Firm* — Amerson Law Firm, PLLC

(57) ABSTRACT

One method disclosed herein includes forming a sacrificial gate structure comprised of upper and lower sacrificial gate electrodes, performing at least one etching process to define a patterned upper sacrificial gate electrode comprised of a plurality of trenches that expose a portion of a surface of the lower sacrificial gate electrode and performing another etching process through the patterned upper sacrificial gate electrode to remove the lower sacrificial gate electrode and a sacrificial gate insulation layer and thereby define a first portion of a replacement gate cavity that is at least partially positioned under the patterned upper sacrificial gate electrode.

16 Claims, 15 Drawing Sheets

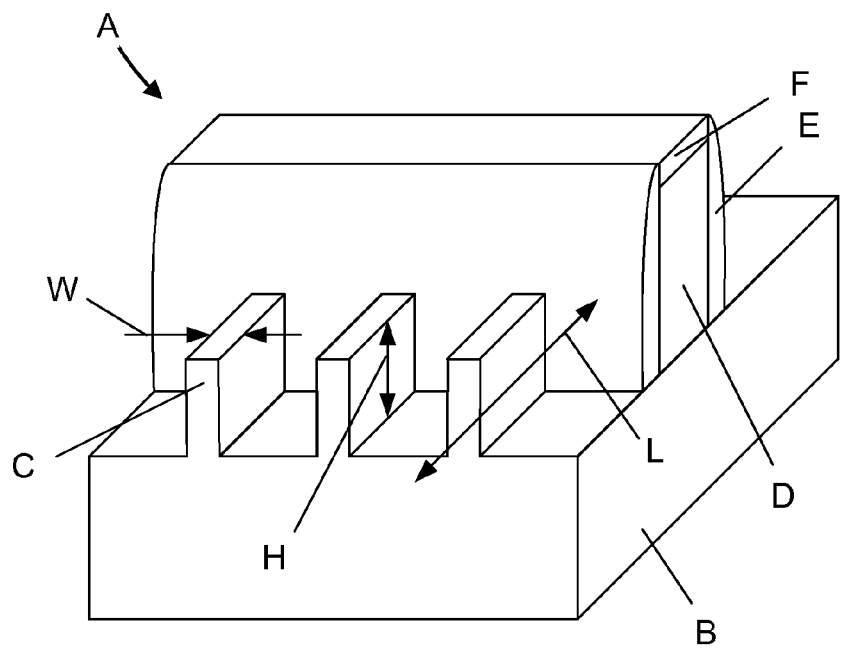
Figure 1A (Prior Art)
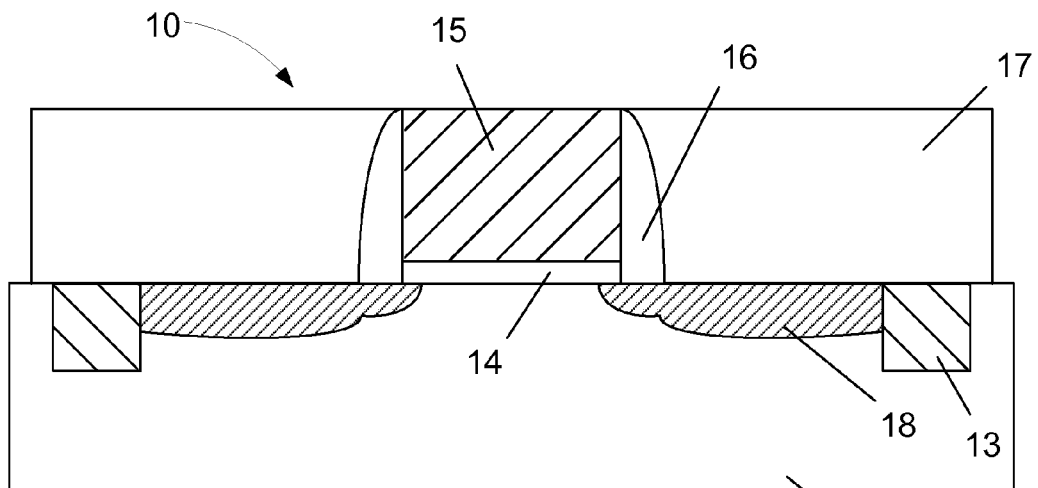
(Prior Art) Figure 1B

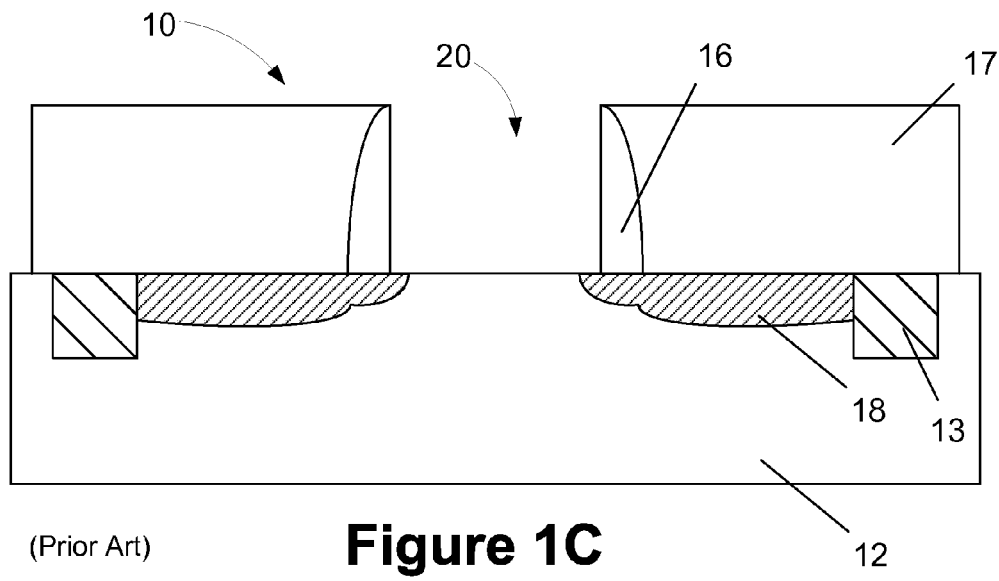
(Prior Art) Figure 1C
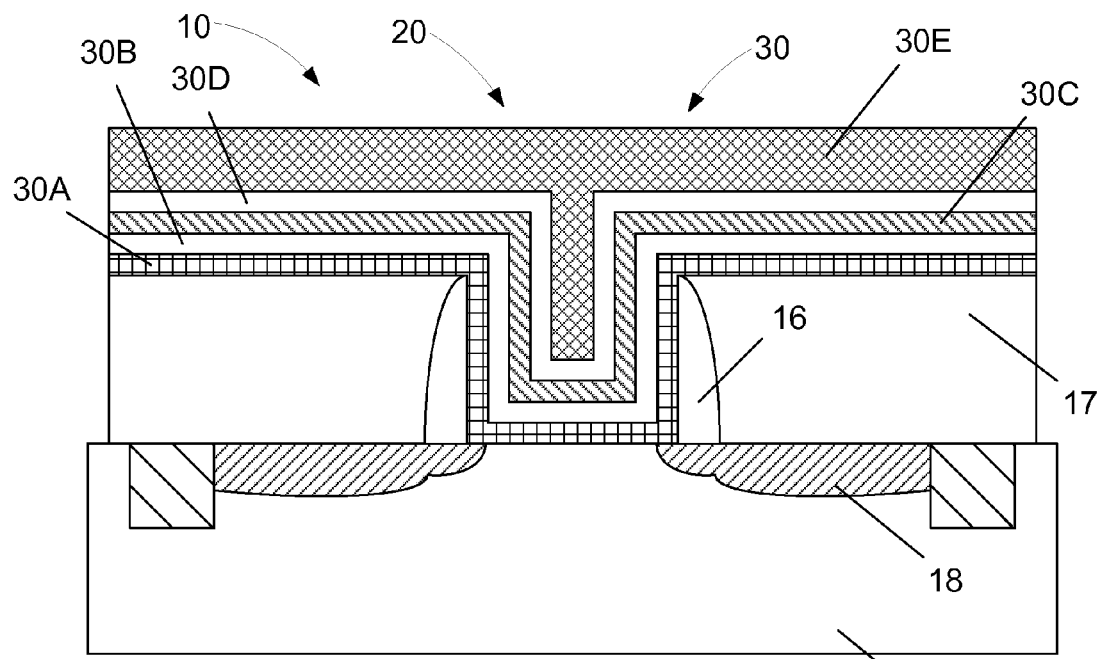
(Prior Art) Figure 1D

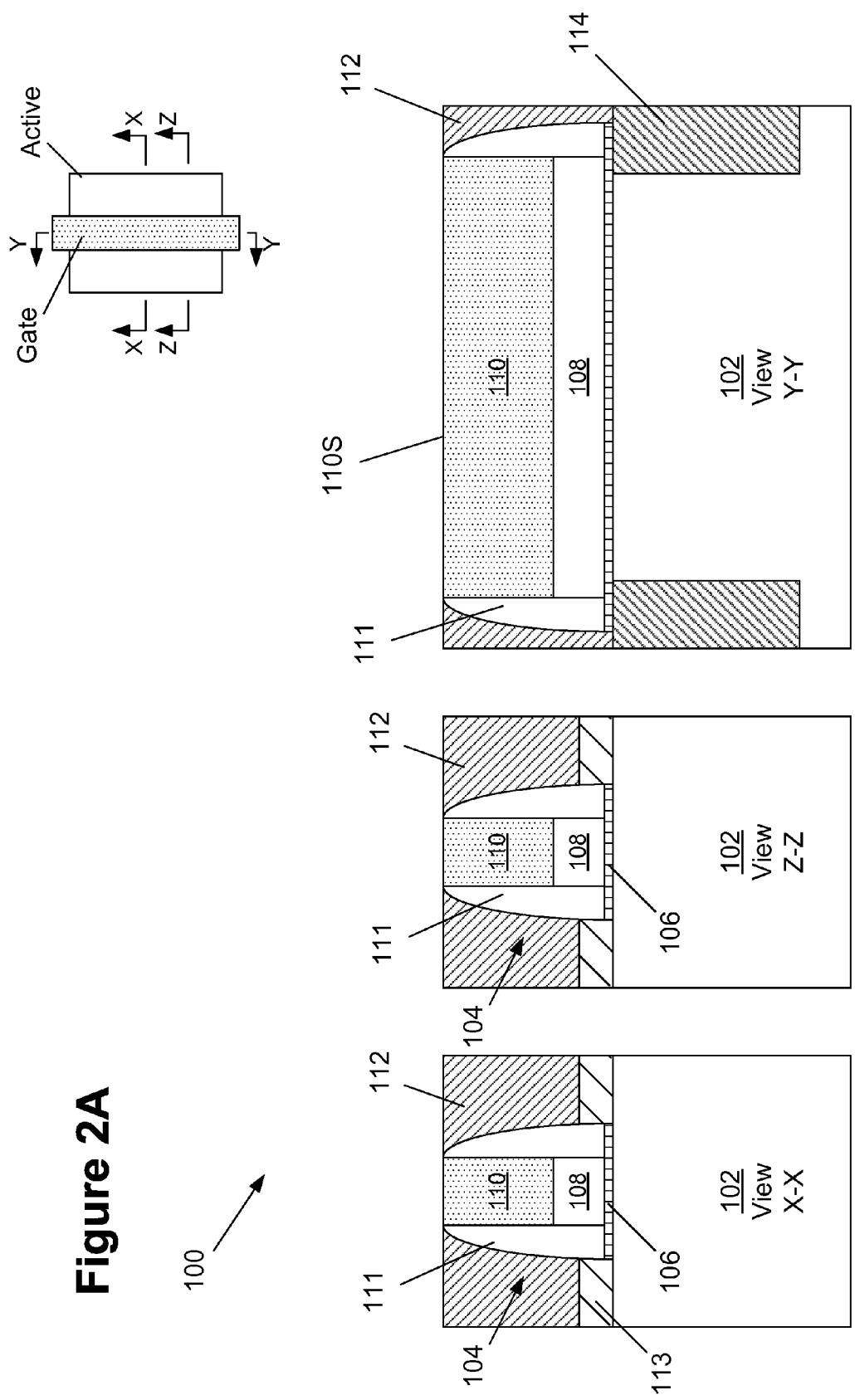

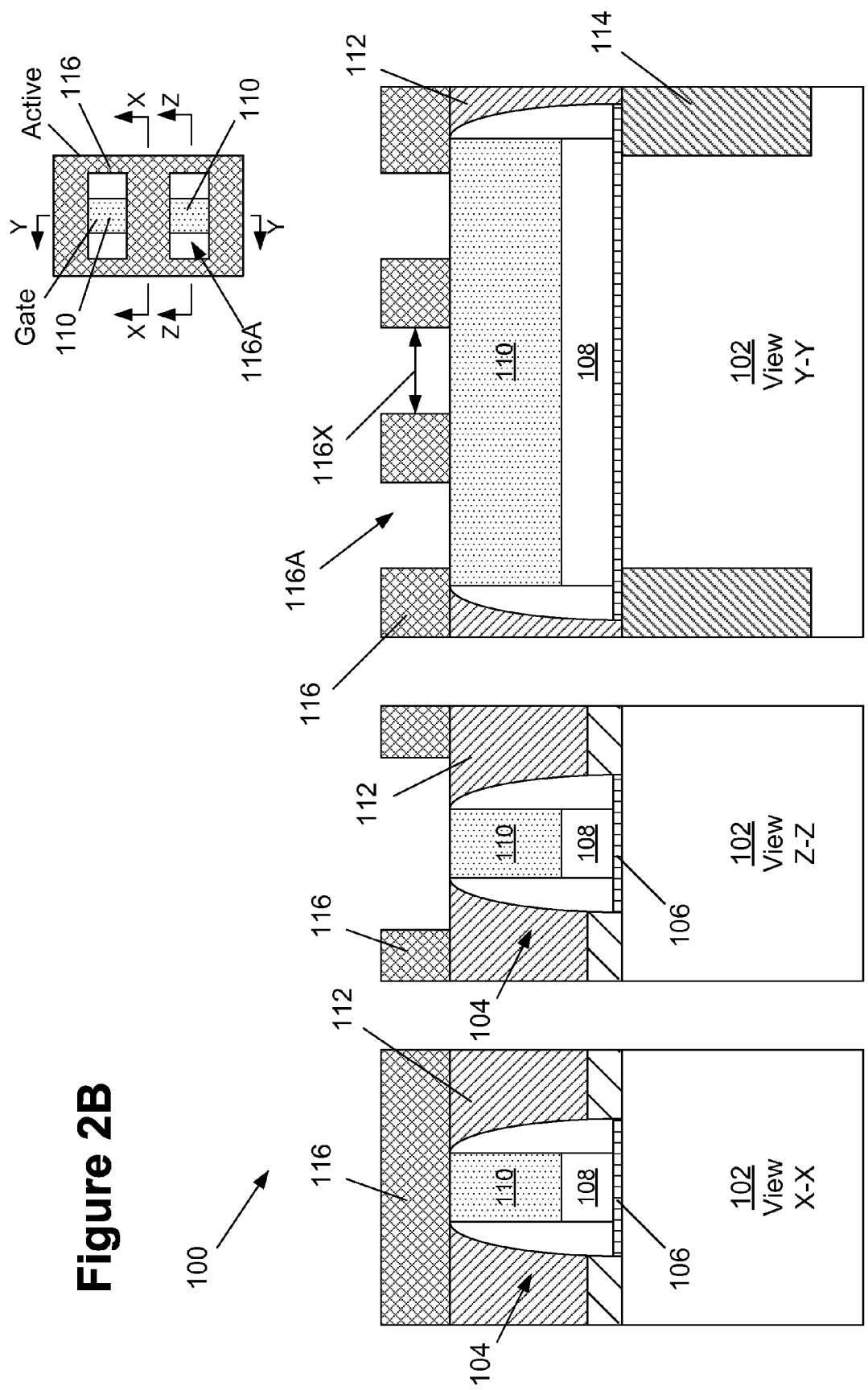

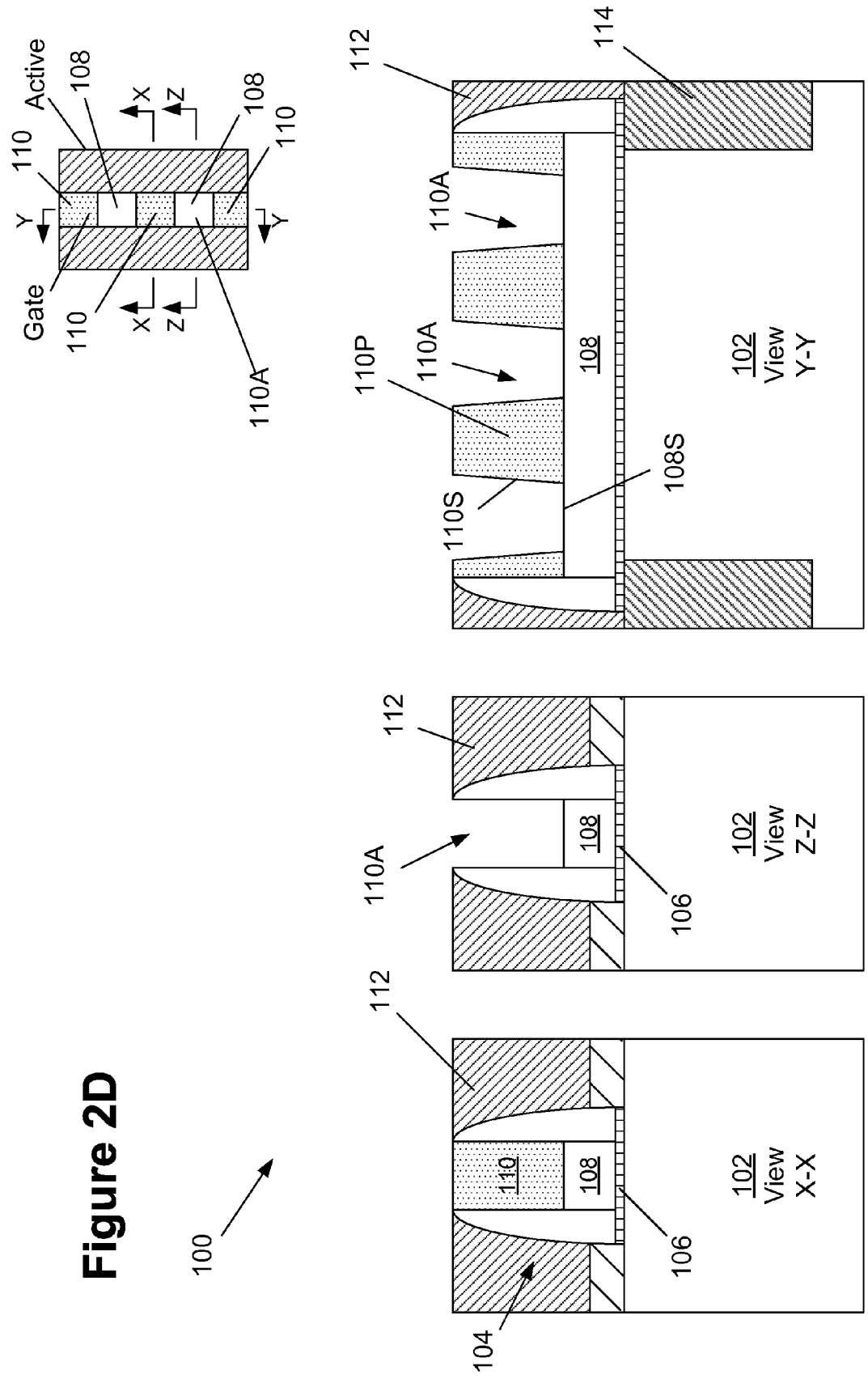

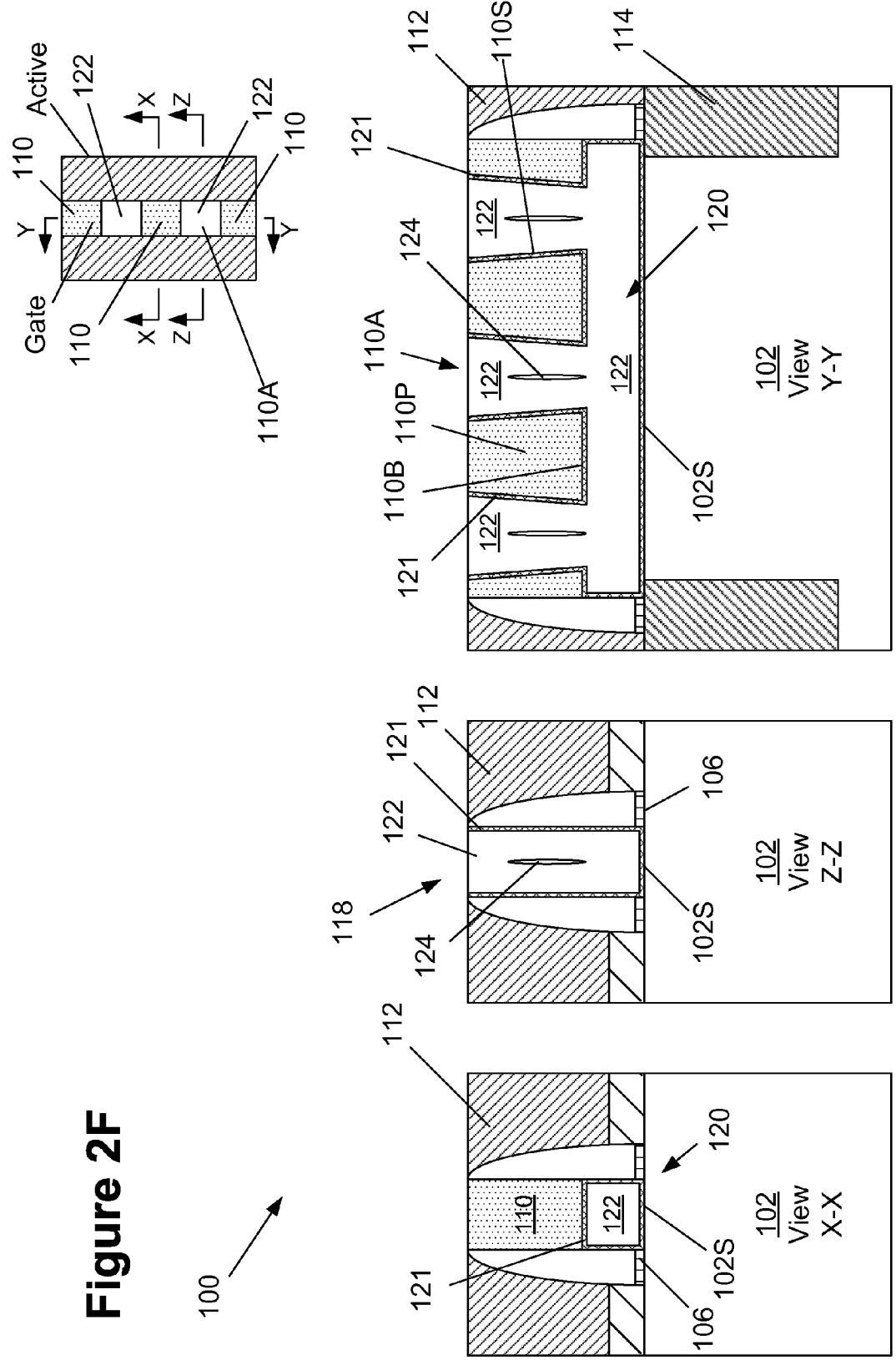

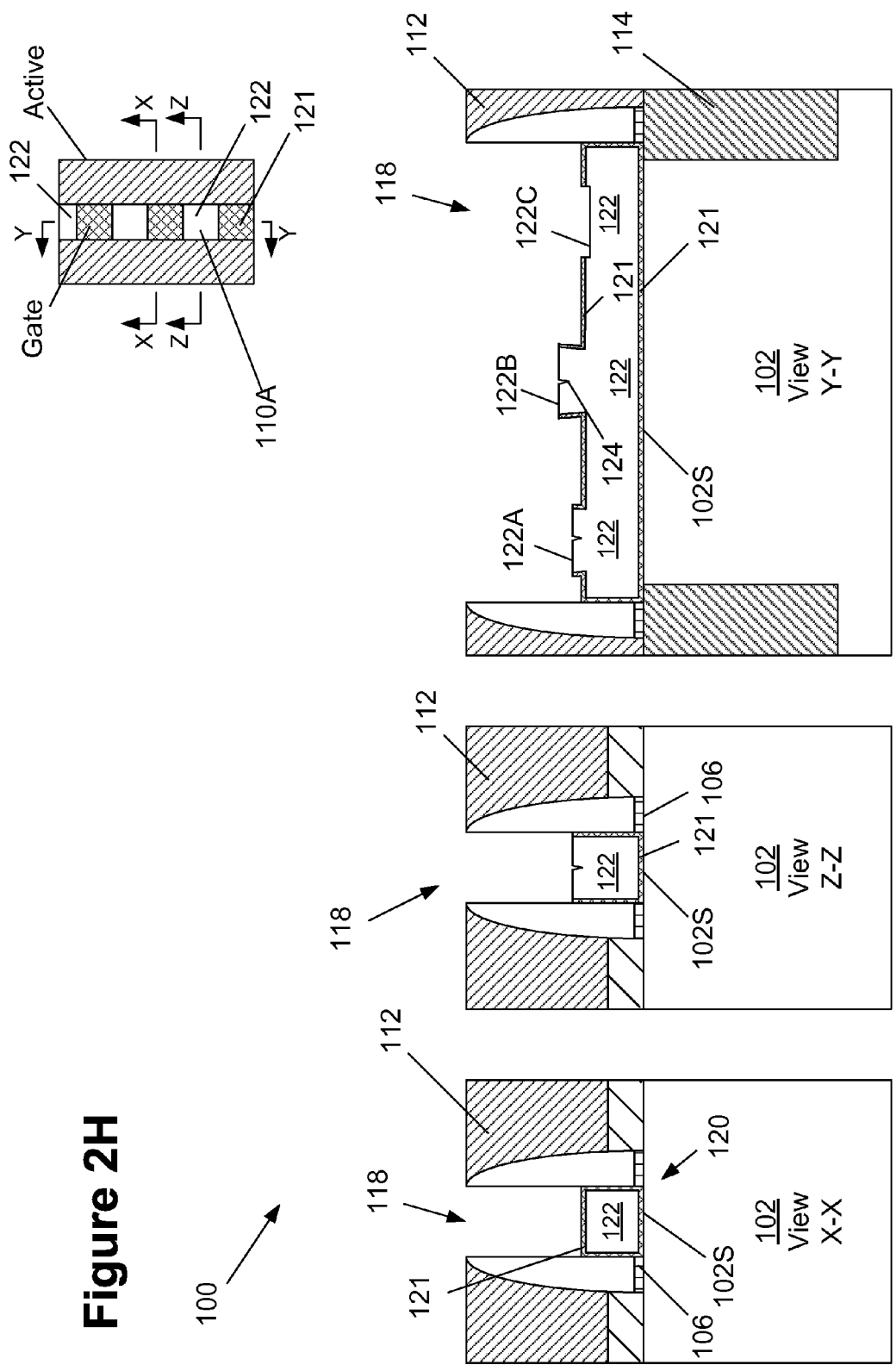

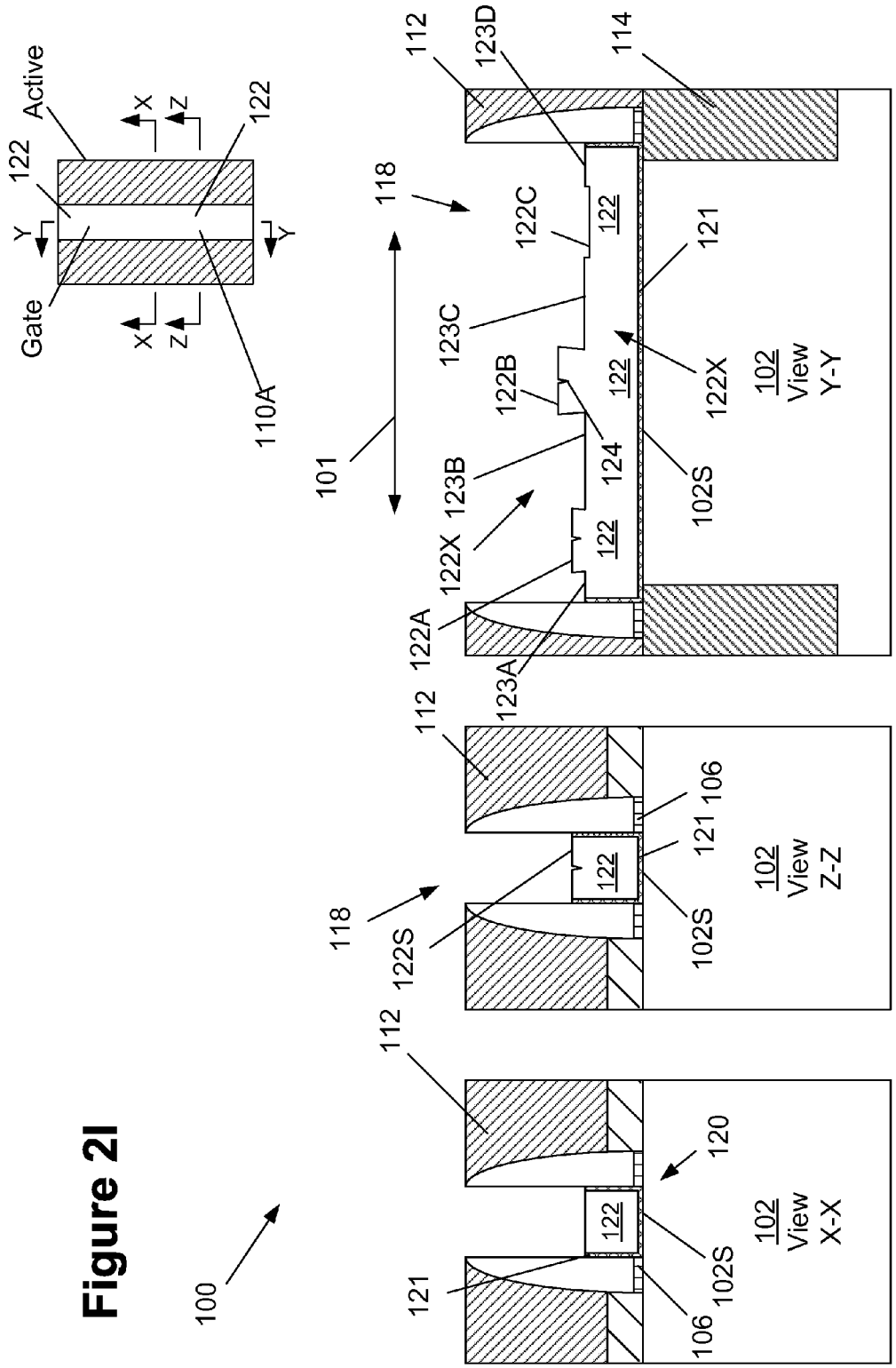

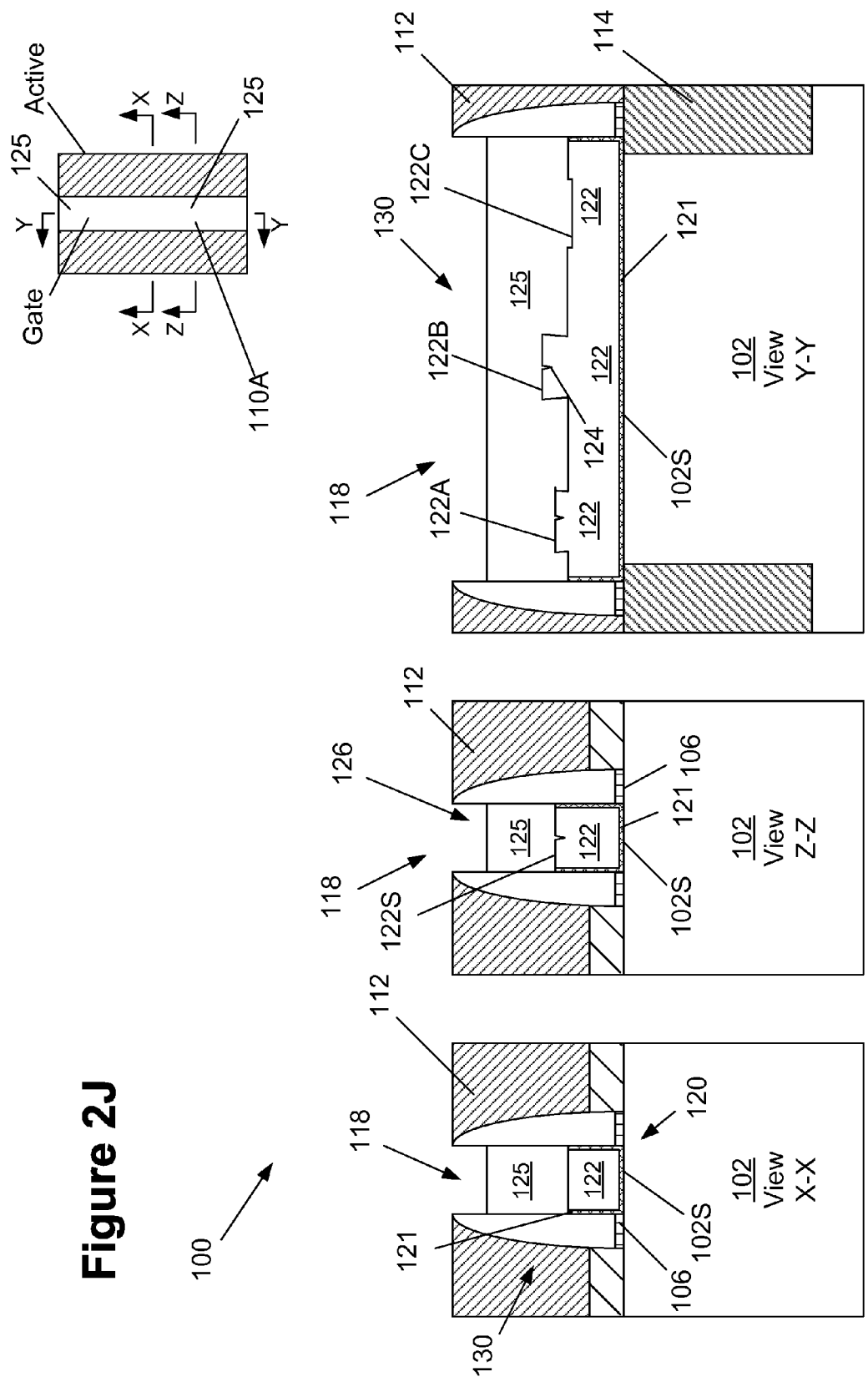

METHODS OF FORMING GATE STRUCTURES FOR SEMICONDUCTOR DEVICES USING A REPLACEMENT GATE TECHNIQUE AND THE RESULTING DEVICES

BACKGROUND OF THE INVENTION

1. Field of the Invention

The present disclosure generally relates to the fabrication of integrated circuits, and, more particularly, to various methods of forming gate structures for semiconductor devices, such as transistors, using a replacement gate technique and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device, the gate structure D may enclose both the sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20-nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1E simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a replacement gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

As the gate length of transistor devices has decreased, the physical size of the gate cavity 20 has also decreased. Thus, it is becoming physically difficult to fit all of the layers of material needed for the replacement gate structure 30 within such reduced-size gate cavities, particularly for NMOS devices, due to the greater number of layers of material that are typically used to form the gate structures for the NMOS devices. For example, as gate lengths continue to decrease, voids or seams may be formed as the various layers of material are deposited into the gate cavity 20. FIG. 1G is a somewhat enlarged view of an illustrative NMOS device that is provided in an attempt to provide the reader with some idea of just how limited the lateral space 20S is within the gate cavity 20 of an NMOS device as the various metal layers 30A-30D are formed in the gate cavity 20. In FIG. 1G, the internal sidewall surfaces of the spacers 16 define a gate cavity 20 having a substantially uniform width 20S throughout the height or depth of the gate cavity 20. As the layers of material in the gate stack for the device are formed in the cavity 20, the remaining space 39 within the gate cavity 20 becomes very small. As the latter metal layers are formed, the lateral space 39 may be about 1-2 nm in width or even smaller. In some cases, the space 39 may be essentially non-existent. This may lead to so-called "pinch-off" of metal layers such that voids or seams may be formed in the overall gate stack, which may result in devices that perform at levels less than anticipated or, in some cases, the formation of devices that are simply not acceptable and have to be discarded.

When manufacturing advanced integrated circuit products using replacement gate structures, particularly in situations where the products also include very tight spacing between source/drain contact structures, such as products using self-aligned source/drain contacts, some amount of the work function metals in the gate cavity 20 must be removed from the gate cavity 20 to make room for additional materials, i.e., to make room within the upper portion of the gate cavity 20 for a bulk conductor material, such as tungsten and aluminum, and a gate cap layer. This process operation is sometimes referred to as work-function chamfering. In such a work-function chamfering process, some form of a protective material must be formed in the gate cavity 20 above the metal layer 30D to protect desired portions of the underlying metal layers during the recess etching process. If the lateral space 39 (to the extent it exists) cannot be reliably filled with such a protective material, such as a flowable oxide material, then the recessing etching process cannot be performed for fear of removing desired portions of the metal layers during the course of performing the recess etching process. Additionally, due to the void/seam formation, the recessing process may result in a significant amount of non-uniformity in the recess etching process and the resulting devices. Also, for devices with different gate lengths, e.g., 15 nm vs. 25 nm, the depth of the recessed gate may also vary due to etch-loading effects, which increase the difficulty in performing a uniform recess etching process.

The present disclosure is directed to various methods of forming gate structures for semiconductor devices, such as transistors, using a replacement gate technique and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate structures for semiconductor devices, such as transistors, using a replacement gate technique and the resulting semiconductor devices. One method disclosed herein includes, among other things, forming a sacrificial gate structure that is comprised of a sacrificial gate insulation layer, a lower sacrificial gate electrode and an upper sacrificial gate electrode, forming a sidewall spacer adjacent opposite sides of at least the upper and lower sacrificial gate electrodes, forming a layer of insulating material adjacent the sidewall spacers, performing at least one first etching process through a patterned mask layer so as to thereby define a patterned upper sacrificial gate electrode comprised of a plurality of trenches that each expose a portion of a surface of the lower sacrificial gate electrode, and performing at least one second etching process through the patterned upper sacrificial gate electrode to remove the lower sacrificial gate electrode and the sacrificial gate insulation layer and thereby define a first portion of a replacement gate cavity that is at least partially positioned under the patterned upper sacrificial gate electrode.

Another illustrative method disclosed herein includes forming a sacrificial gate structure above a surface of a semiconductor substrate, the sacrificial gate structure comprising a sacrificial gate insulation layer, a lower sacrificial gate electrode and an upper sacrificial gate electrode, wherein the upper sacrificial gate electrode and the lower sacrificial gate electrode are made of materials that may be selectively etched relative to one another, forming a sidewall spacer adjacent opposite sides of at least the upper and lower sacrificial gate electrodes, forming a layer of insulating material adjacent the sidewall spacers, performing at least one first etching process through a patterned mask layer so as to thereby define a patterned upper sacrificial gate electrode comprised of a plurality of trenches that each expose a portion of a surface of the lower sacrificial gate electrode, and performing at least one second etching process through the patterned upper sacrificial gate electrode to remove the lower sacrificial gate electrode and the sacrificial gate insulation layer and thereby define a first portion of a replacement gate cavity that is at least partially positioned under the patterned upper sacrificial gate electrode and performing at least one process operation to form a first portion of a replacement gate structure positioned in at least the first portion of the replacement gate cavity under the patterned upper sacrificial gate electrode.

One illustrative device disclosed herein includes, among other things, a gate structure positioned above a surface of a semiconductor substrate, wherein the gate structure includes a high-k gate insulation layer positioned above the surface of the substrate, at least one work-function adjusting layer of material positioned above the high-k gate insulation layer, wherein the at least one work-function adjusting layer of material has an upper surface with a stepped profile when viewed in cross-section taken in a gate width direction of the transistor device, a layer of conductive material positioned on the stepped upper surface of the at least one work-function adjusting layer of material, a sidewall spacer positioned adjacent opposite sides of at least a portion of the gate structure and a gate cap layer positioned above the layer of conductive material.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1G depict one illustrative prior art method of forming a gate structure of a transistor using a so-called "replacement gate" technique; and FIGS. 2A-2K depict various illustrative methods disclosed herein of forming gate structures for semiconductor devices using a replacement gate technique and the resulting semiconductor devices.

Figure 1E:
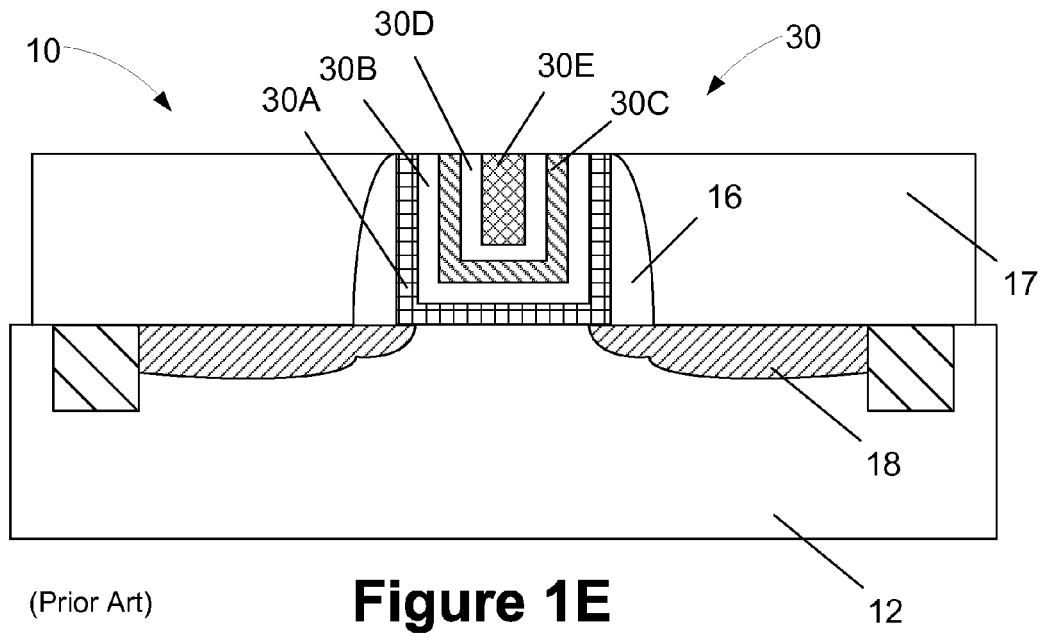
Figure 1F:
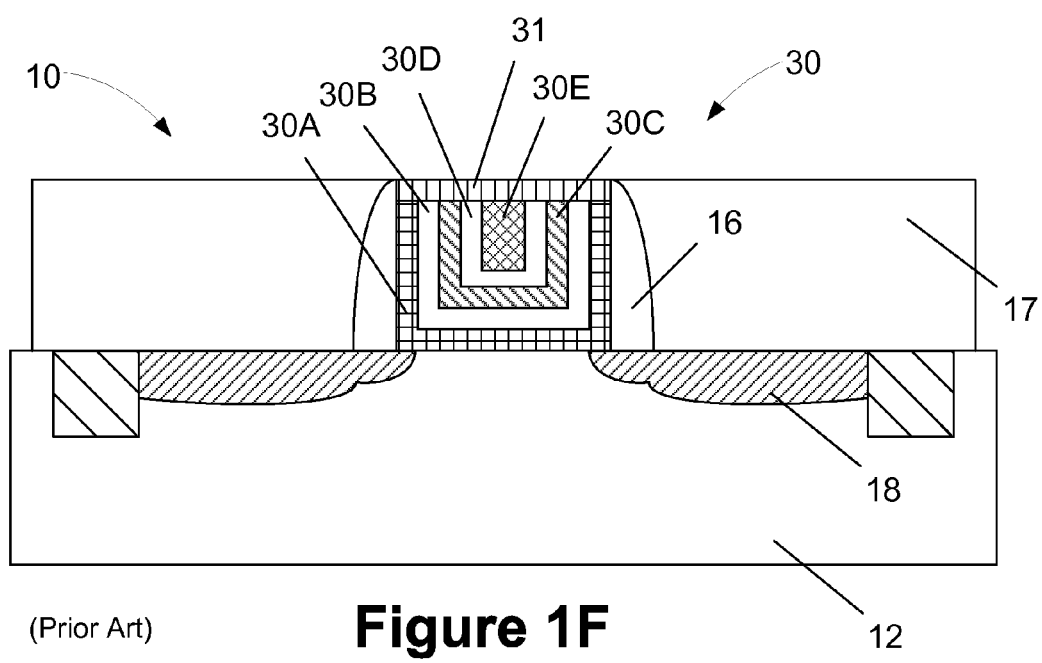
Figure 1G:
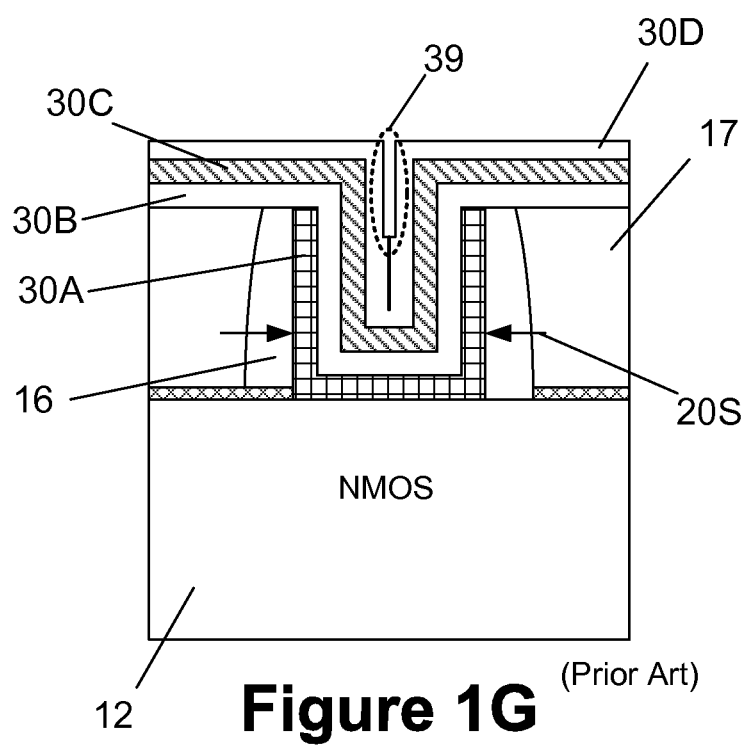

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming gate structures for semiconductor devices using a replacement gate technique. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, NMOS, PMOS, CMOS, etc., and they may be employed in manufacturing a variety of different devices, e.g., memory devices, logic devices, ASICs, etc. Of course, the inventions disclosed herein should not be considered to be limited to the illustrative examples depicted and described herein. With reference to the attached figures, various illustrative embodiments of the methods and devices disclosed herein will now be described in more detail.

As will be appreciated by those skilled in the art after a complete reading of the present application, the methods and structures disclosed herein may be used when forming either planar or 3D transistor devices. An illustrative device 100 in the form of a planar device will be depicted for purposes of disclosing the subject matter set forth herein. Additionally, various doped regions, e.g., source/drain regions, halo implant regions, well regions and the like, are not depicted in the attached drawings. Of course, the inventions disclosed herein should not be considered to be limited to the illustrative examples depicted and described herein. Moreover, the transistor devices that are depicted in the attached drawings may be either NMOS or PMOS devices. The illustrative transistor device 100 depicted in the drawings is formed above an illustrative substrate 102 that may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. Thus, the terms "substrate" or "semiconductor substrate" should be understood to cover all semiconducting materials and all forms of such materials.

In general, the drawings contain a plan view and various cross-sectional views that are taken where indicated in the plan view. As shown in the plan view in FIG. 2A, the views "X-X" and "Z-Z" are cross-sectional views taken through the gate structure of the device 100 in the gate-length direction of the device 100 at different locations along the gate structure. The view "Y-Y" is a cross-sectional view that is taken through the long axis of the gate structure, i.e., a cross-sectional view through the gate structure in the gate-width direction of the transistor device.

In the examples disclosed herein, the device 100 will be formed using a replacement gate technique. Accordingly, FIG. 2A depicts the device 100 at a point in fabrication wherein several layers of material and structures have been formed above the substrate 102. More specifically, at the point of fabrication depicted in FIG. 2A, the device 100 includes a sacrificial gate structure 104 comprised of a sacrificial gate insulation layer 106, a lower dummy or sacrificial gate electrode 108, an upper sacrificial or dummy gate electrode 110, sidewall spacers 111 and a layer of insulating material 112. Also depicted in FIG. 2A, view "Y-Y," are schematically depicted isolation regions 114 that have been formed in the substrate 102. FIG. 2A depicts the device 100 after one or more chemical mechanical polishing (CMP) processes were performed to remove any materials above the sacrificial gate electrode 110 (such as the protective cap layer (not shown)) such that the upper surface 110S of the upper sacrificial gate electrode 110 is exposed.

The device depicted in FIG. 2A may be comprised of a variety of different materials, e.g., the sacrificial gate insulation layer 106 may be comprised of silicon dioxide. In general, the lower sacrificial gate electrode 108 and the upper sacrificial gate electrode 110 should be made of materials that exhibit a high degree of etch selectively relative to one another. Thus, in one embodiment, the lower sacrificial gate electrode 108 may be comprised of silicon-germanium ($Si_xGe_{1-x}$) while the upper sacrificial gate electrode 110 may be comprised of a silicon-containing material such as silicon, polysilicon or amorphous silicon, etc. The sidewall spacers 111 and the gate cap layer (not shown) may be comprised of silicon nitride while the layer of insulating material 112 and the isolation regions 114 may be comprised of silicon dioxide. The sidewall spacers 111 may be formed by depositing a layer of spacer material and thereafter performing an anisotropic etching process to produce the spacers 111. Also depicted in FIG. 2A are regions of illustrative epi semiconductor material 113 that were formed in/or above the source/drain regions of the device 100. Of course, such epi semiconductor material 113 need not be formed to practice the various inventions disclosed herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2B depicts the device 100 after a patterned masking layer 116, e.g., a patterned hard mask layer, has been formed above the substrate 102. The patterned masking layer 116 has a plurality of openings 116A spaced apart along the gate-width direction of the sacrificial gate structure 104. That is, the patterned masking layer 116 exposes some, but not all, of the upper sacrificial gate electrode 110. The size of the openings 116A may vary depending upon the particular application. The openings 116A have a bar-shaped configuration to ensure that, even if there is some horizontal misalignment, the desired portions of the upper sacrificial gate electrode 110 are exposed. In some embodiments, the size 116X of the openings 116A (in the gate width direction) may be on the order of about the gate length dimension ($L_g$) of the device 100 or slightly larger than $L_g$. Additionally, the density of the openings 116A may be smaller than the density of the various gate structures formed above the substrate 102. The view Z-Z is taken through the gate structure 104 and one of the openings 116A in the masking layer 116. The view X-X is taken through the gate structure 104 at a point outside of the openings 116A. Note that the plan view in FIG. 2B (and subsequent drawings) does not agree with the cross-sectional view Z-Z in terms of the number of openings 116A depicted (two in the plan view versus three in view Z-Z) so as not to overcrowd the plan view drawing and hopefully facilitate disclosures of various aspects disclosed herein. The patterned masking layer 116 is intended to be representative in nature as it may be comprised of a variety of materials, such as, for example, a photoresist material, silicon nitride, silicon oxynitride, etc. Moreover, the patterned masking layer 116 may be comprised of multiple layers of material, such as, for example, a silicon nitride layer and a layer of silicon dioxide. The patterned masking layer 116 may be formed by depositing the layer(s) of material that comprise the masking layer 116 and thereafter directly patterning the masking layer 116 using known photolithography and etching techniques. Alternatively, the patterned masking layer 116 may be formed by using known sidewall image transfer techniques. Thus, the particular form and composition of the patterned masking layer 116 and the manner in which it is made should not be considered a limitation of the present invention. In the case where the patterned masking layer 116 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

Figure 2C:
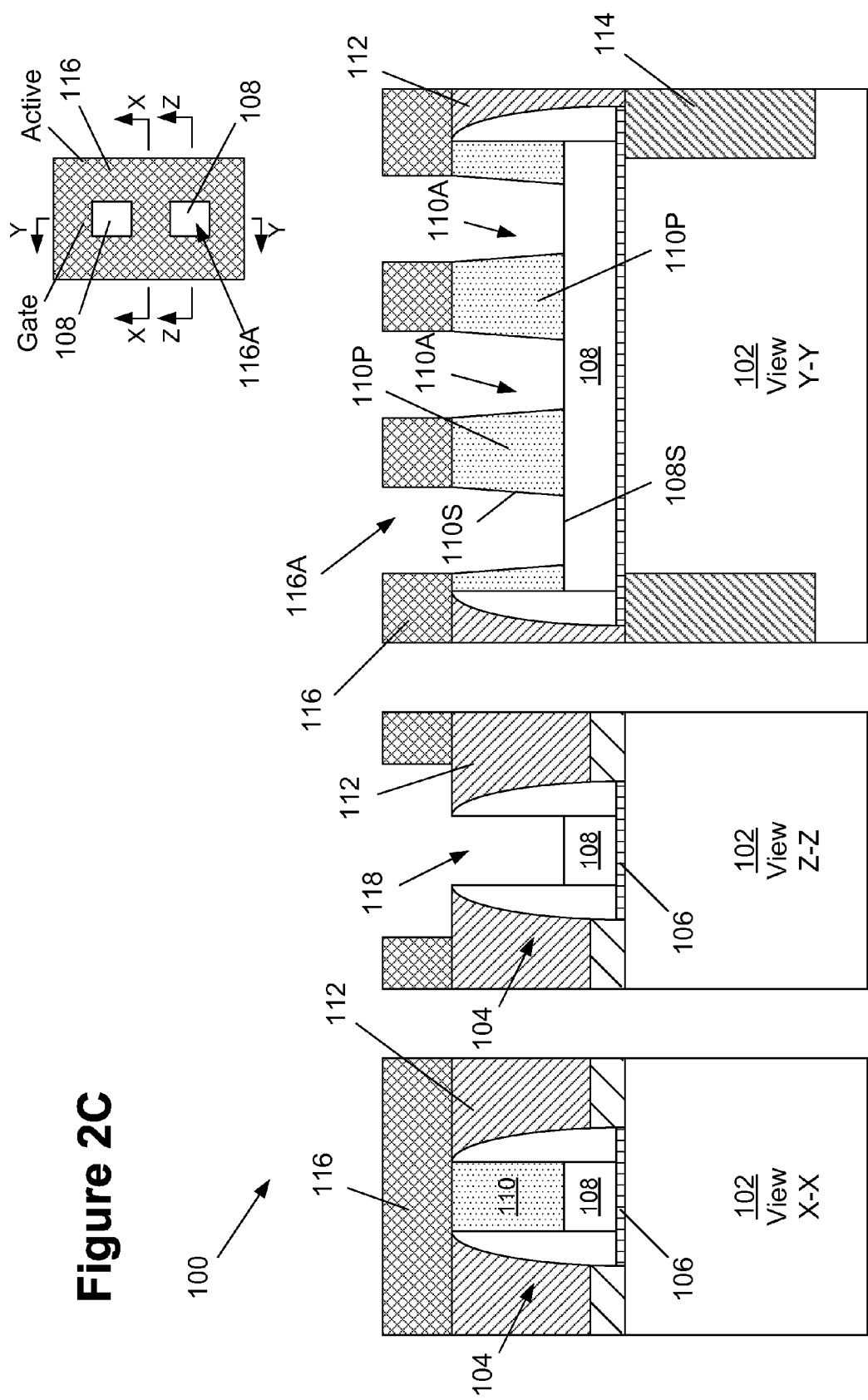

FIG. 2C depicts the device 100 after an anisotropic etching process was performed through the patterned masking layer 116 to remove the exposed portions of the upper sacrificial gate electrode 110 selectively relative to the lower sacrificial gate electrode 108 and the interlayer dielectric 112. This etching process results in the definition of a plurality of trenches 110A that expose the upper surface 108S of the lower sacrificial gate electrode 108. The etching process also results in a patterned upper sacrificial gate electrode 110P. Note that, due to the nature of the trench etching process, the sidewalls 110S of the trenches 110A are inwardly tapered, thereby resulting in the trenches 110A being wider at the top of the trench 110A than they are at the bottom of the trench 110A.

FIG. 2D depicts the device 100 after the patterned masking layer 116 was removed.

Figure 2E:
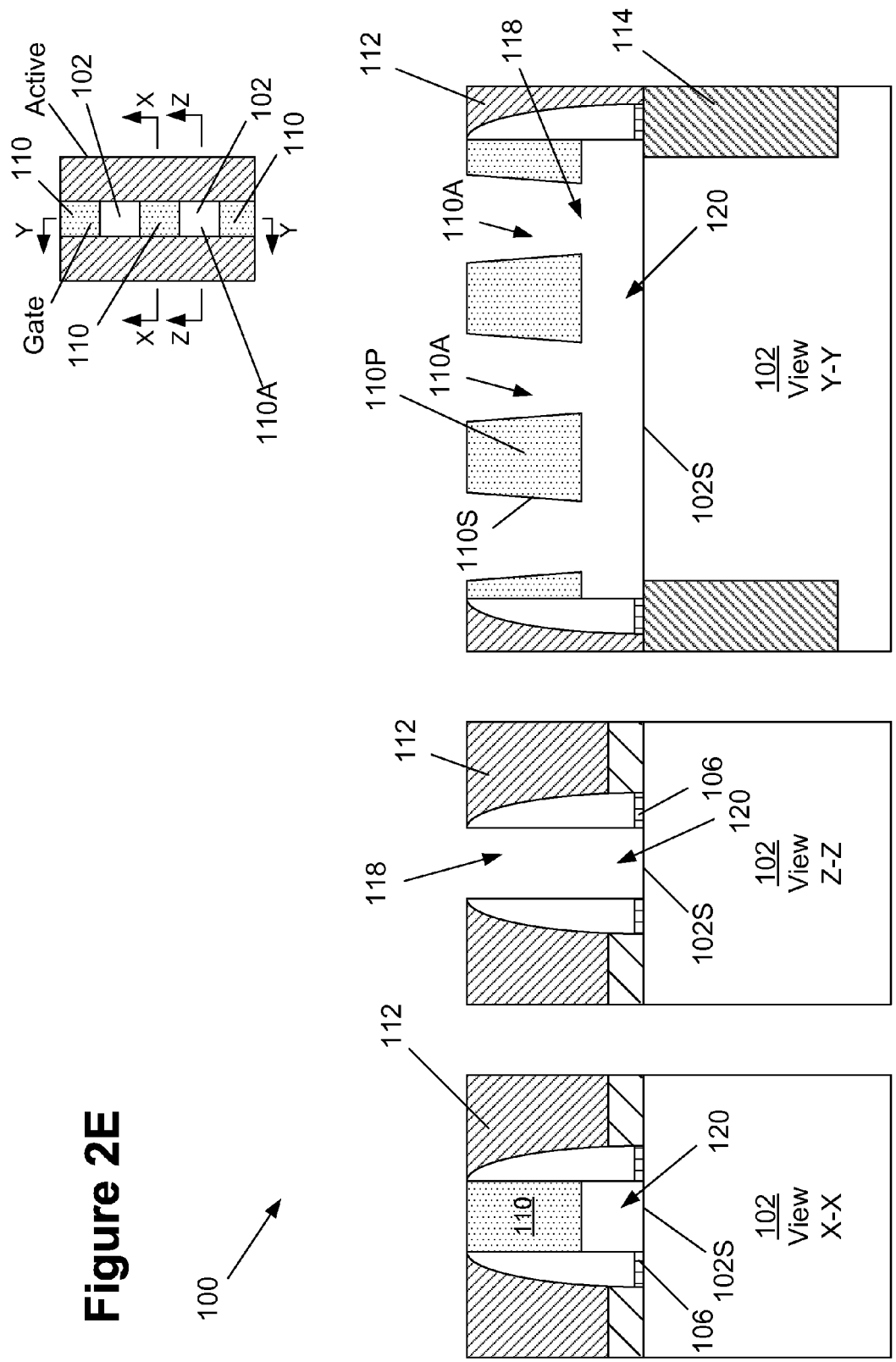

Next, as shown in FIG. 2E, one or more wet isotropic etching processes were performed through the trenches 110A in the patterned upper sacrificial gate electrode 110P to remove the lower sacrificial gate electrode 108 selectively relative to the upper sacrificial gate electrode 110 and the surrounding materials and to remove the sacrificial gate insulation layer 106. This etching process results in the definition of a space or cavity 120 under the patterned upper sacrificial gate electrode 110P and also exposes the upper surface 102S of the substrate 102. The cavity or space 120 effectively defines a first portion of what will ultimately become the replacement gate cavity 118 for the final replacement gate structure for the device 100.

The next major process sequence involves formation of portions of the replacement gate structure for the device 100. The replacement gate structure that will be depicted herein is intended to be representative in nature of any type of gate structure that may be employed in manufacturing integrated circuit products using so-called gate-last (replacement-gate) manufacturing techniques. Accordingly, with reference to FIG. 2F, a pre-clean process was performed in an attempt to remove all foreign materials from within the replacement gate cavity 118, i.e., within the cavity 120 and the openings 110A in the patterned upper sacrificial gate electrode 110P, prior to forming the various layers of material that will become part of the replacement gate structure. Next, a high-k (k value greater than 10) gate insulation layer 121, such as hafnium oxide (or the other high-k materials noted in the background section of this application), was deposited across the device 100 and within the first portion of the replacement gate cavity 118 above the substrate 102 by performing a conformal deposition process, i.e., an ALD or CVD deposition process. If desired, a thin interfacial layer of silicon dioxide (not shown) may be formed prior to the formation the high-k gate insulation layer 121. That is, the high-k gate insulation layer 121 is formed on the surface 102S of the substrate and on the bottom surfaces 110B and sidewalls 110S of the patterned upper sacrificial gate electrode 110P. Next, at least one work function adjusting metal layer 122 (e.g., a layer of titanium nitride or TiAlC depending upon the type of transistor device being manufactured) was deposited on the high-k gate insulation layer 121 and within the first portion of the replacement gate cavity 118 by performing a conformal ALD or CVD deposition process. Of course, the work function adjusting metal layer 122 may be comprised of any of the metals described in the background section of this application and more than one layer of work function metal may be formed in the replacement gate cavity 118, depending upon the particular device under construction. Due to the very small sizes of the replacement gate cavities 118 in modern transistor devices, even using the novel methods disclosed herein, the formation of the work function adjusting metal layer 122 may result in the formation of very narrow openings or voids 124. i.e., pinch-off may occur.

Figure 2G:
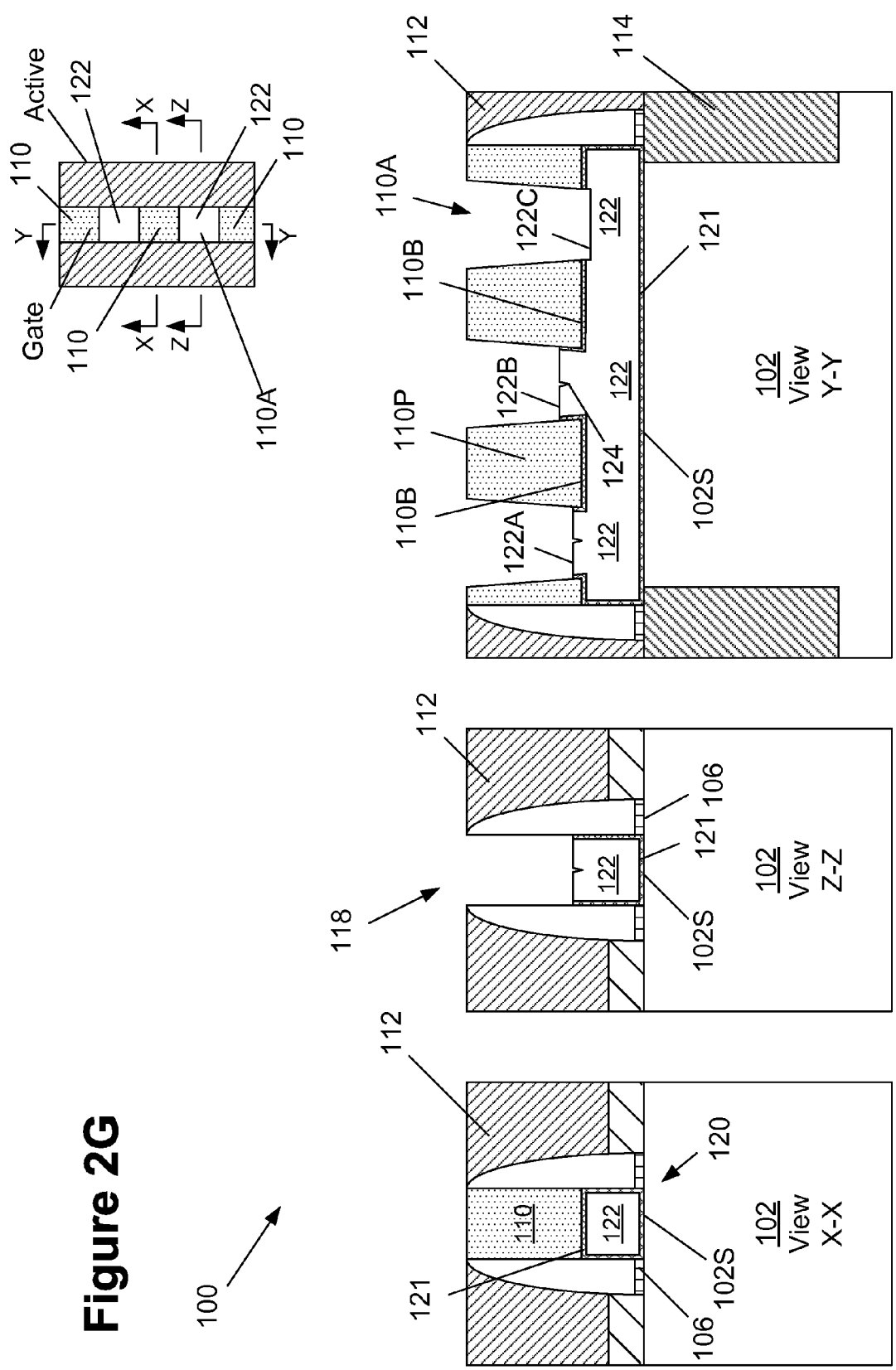

FIG. 2G depicts the device 100 after one or more timed, wet or dry etching processes were performed to remove the desired amounts of the work function adjusting metal layer 122 and the high-k gate insulation layer 121 so as to make room within the upper portion of the gate cavity 118 for a bulk conductor material, such as tungsten and aluminum, and a gate cap layer. These process operations expose uneven surfaces 122A-C of the work function adjusting metal layer 122.

The degree of unevenness of the surfaces 122A-C is exaggerated in the drawings for purposes of explanation. However, as compared to the prior art technique of forming replacement gate structures, the unevenness of the surfaces 122A-C is less and, moreover, it is more uniform across all of the devices that are formed above the substrate, i.e., there is less device-to-device variations. This is due, in part, to the fact that the size of the opening of the trenches 110A in the patterned upper sacrificial gate electrode 110P is substantially uniform across all of the various devices being formed and because the inwardly tapered shape of the trenches 110A can be readily controlled. Thus, even if the work function metal 122 exhibits some surface non-uniformity, the total density of such non-uniformities is along the gate-width direction of the device 100 since the bottom surface 110B of the remaining portions of the patterned upper sacrificial gate electrode 110P insure that substantial portions of the work function adjusting metal layer 122 and high-k gate insulation layer 121, i.e., the portions underlying the patterned upper sacrificial gate electrode 110P, are substantially planar.

FIG. 2H depicts the device 100 after one or more etching processes were performed to remove the patterned upper sacrificial gate electrode 110P selectively relative to the work function adjusting metal layer 122, the high-k gate insulation layer 121 and the surrounding structures. Removal of the patterned upper sacrificial gate electrode 110P defines the remaining portion of the replacement gate cavity 118.

FIG. 2I depicts the device 100 after one or more etching processes were performed to remove the substantially horizontally oriented portions of the high-k gate insulation layer 121 selectively relative to the work function adjusting metal layer 122 and the surrounding structures. This exposes the spaced-apart, substantially planar, upper surfaces 123A-D of the work function adjusting metal layer 122 that were positioned under the remaining portions of the patterned upper sacrificial gate electrode 110P and therefore not subjected to the recess etching process depicted in FIG. 2G. The substantially planar surfaces 123A-D are laterally spaced apart from one another along the gate-width direction 101 of the device 100. As depicted, using the methods disclosed herein, the overall upper surface 122X of the work function metal 122 has a up/down stepped-configuration when viewed in cross-section along the gate-width direction 101, i.e., in the view Y-Y. The steps in this stepped-configuration are periodic, not random. For example, in the gate width direction 101, the projection represented by the surface 122B is positioned between the substantially planar surfaces 123B and 123C. Also note that the substantially planar surfaces 123A-D each has an upper surface that is positioned at approximately the same height level above the surface 102S of the substrate 102. It is also worth noting that the projections represented by the surfaces 122A and 122B are positioned at a height level that is above the upper surfaces of the spaced-apart, substantially planar surfaces 123A-D relative to the upper surface 102S of the substrate 102. Lastly, the upper surface of the recessed surface 122C is positioned at a height level that is below an upper surface of the spaced-apart, substantially planar surfaces 123A-D relative to the upper surface 102S of the substrate 102.

FIG. 2J depicts the device 100 after several process operations were performed. First, a bulk conductive material layer 125, such as tungsten or aluminum, was blanket-deposited above the substrate so as to over-fill the replacement gate cavity 118 and deposit the bulk conductive material layer 125 on the overall stepped upper surface 122X of the work function adjusting metal layer 122. Thereafter, a CMP process was performed to remove excess portions of the bulk conductive material layer 125 positioned above the surface of the layer of insulating material 112. Next, a recess etching process was performed so as to remove a desired amount of the bulk conductive material layer 125 and thereby define a gate cap cavity 126 above the recessed bulk conductive material layer 125. The combination of the high-k gate insulation layer 121, the work function adjusting metal layer 122 and the recessed bulk conductive material layer 125 shown in FIG. 2J constitutes the final replacement gate structure 130 for the device 100.

Figure 2K:
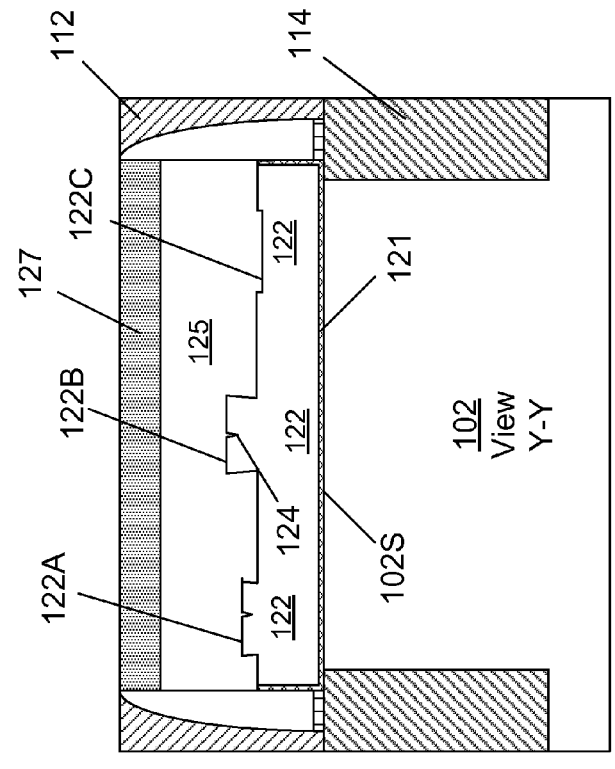
Figure 2K:
Figure 2K:
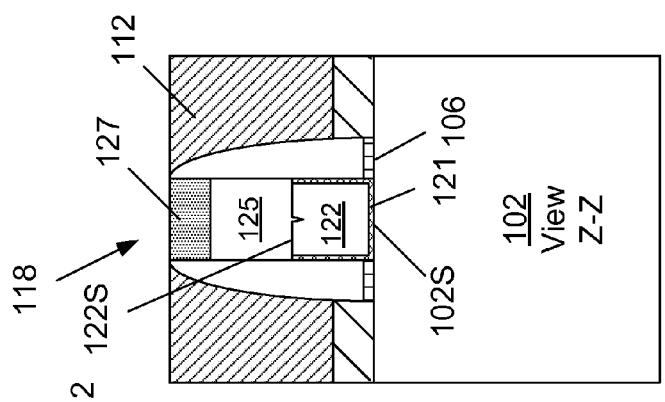
Figure 2K:
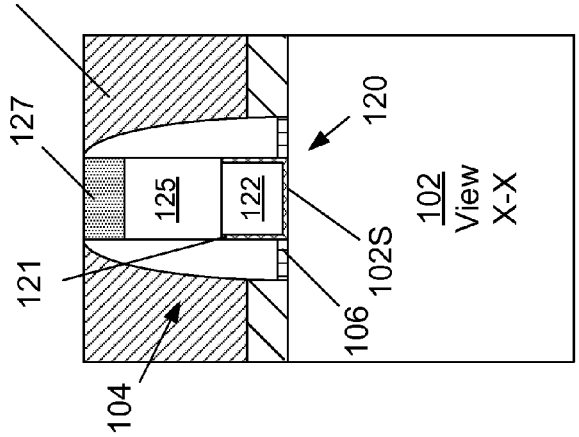

FIG. 2K depicts the device 100 after an illustrative gate cap layer 127 was formed in the recess 126 above the recessed bulk conductive material layer 125. The gate cap layer 127 may be formed from a variety of different materials, e.g., typically silicon nitride. The gate cap layer 127 may be formed by depositing a layer of gate cap material so as to over-fill the recess 126 formed in the replacement gate cavity 118 above the replacement gate structure 130 and, thereafter, performing a CMP process to remove excess portions of the gate cap material layer positioned above the surface of the layer of insulating material 112. The gate cap layer 127 is formed so as to protect the underlying gate materials during subsequent processing operations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:

forming a sacrificial gate structure above a surface of a semiconductor substrate, said sacrificial gate structure comprising a sacrificial gate insulation layer, a lower sacrificial gate electrode positioned above said sacrificial gate insulation layer and an upper sacrificial gate electrode positioned above said lower sacrificial gate electrode;

forming a sidewall spacer adjacent opposite sides of at least said lower sacrificial gate electrode and said upper sacrificial gate electrode;

forming a layer of insulating material adjacent said sidewall spacers;

performing at least one first etching process through a patterned mask layer so as to thereby define a patterned upper sacrificial gate electrode comprised of a plurality of trenches that each expose a portion of a surface of said lower sacrificial gate electrode; and performing at least one second etching process through said patterned upper sacrificial gate electrode to remove said lower sacrificial gate electrode and said sacrificial gate insulation layer and thereby define a first portion of a replacement gate cavity that is at least partially positioned under said patterned upper sacrificial gate electrode.

2. The method of claim 1, further comprising, with the patterned upper sacrificial gate electrode in position, performing at least one deposition process through said trenches in said patterned upper sacrificial gate electrode to form a first portion of a replacement gate structure positioned in at least the first portion of said replacement gate cavity under said patterned upper sacrificial gate electrode.

3. The method of claim 2, wherein performing said at least one deposition process comprises:
performing a first deposition process to deposit a layer of high-k insulating material on an upper surface of said substrate, on a bottom surface of said patterned upper sacrificial gate electrode and on sidewalls of said trenches; and
performing a second deposition process to deposit at least one work-function adjusting material layer on said high-k insulating material.

4. The method of claim 3, further comprising performing at least one third etching process to remove portions of said high-k gate insulation layer and said at least one work-function adjusting material layer so as to define at least a lower portion of said replacement gate structure that is at least partially positioned within said first portion of said replacement gate cavity.

5. The method of claim 4, further comprising, after performing said at least one third etching process, performing at least one fourth etching process to remove said patterned upper sacrificial gate electrode so as to expose portions of said high-k gate insulation layer that were positioned under said patterned upper sacrificial gate electrode.

6. The method of claim 5, further comprising, after performing said at least one fourth etching process, performing a fifth etching process to remove said exposed portions of said high-k gate insulation layer so as to expose an upper surface of said work-function adjusting material layer of said lower portion of said replacement gate structure.

7. The method of claim 6, further comprising forming at least one layer of conductive material above said exposed upper surface of said lower portion of said replacement gate structure, wherein a final replacement gate structure for a transistor device is comprised of at least said lower replacement gate structure and said at least one layer of conductive material.

8. The method of claim 1, wherein said upper sacrificial gate electrode and said lower sacrificial gate electrode are made of materials that are selectively etchable relative to one another.

9. The method of claim 1, wherein said upper sacrificial gate electrode is comprised of silicon, amorphous silicon or polysilicon, and said lower sacrificial gate electrode is comprised of silicon-germanium.

10. A method, comprising:
forming a sacrificial gate structure above a surface of a semiconductor substrate, said sacrificial gate structure comprising a sacrificial gate insulation layer, a lower sacrificial gate electrode positioned above said sacrificial gate insulation layer and an upper sacrificial gate electrode positioned above said lower sacrificial gate electrode, wherein said upper sacrificial gate electrode and said lower sacrificial gate electrode are made of materials that are selectively etchable relative to one another;
forming a sidewall spacer adjacent opposite sides of at least said lower sacrificial gate electrode and said upper sacrificial gate electrode;
forming a layer of insulating material adjacent said sidewall spacers;
performing at least one first etching process through a patterned mask layer so as to thereby define a patterned upper sacrificial gate electrode comprised of a plurality of trenches that each expose a portion of a surface of said lower sacrificial gate electrode;
performing at least one second etching process through said patterned upper sacrificial gate electrode to remove said lower sacrificial gate electrode and said sacrificial gate insulation layer and thereby define a first portion of a replacement gate cavity that is at least partially positioned under said patterned upper sacrificial gate electrode; and
performing at least one process operation to form a first portion of a replacement gate structure positioned in at least the first portion of said replacement gate cavity under said patterned upper sacrificial gate electrode.

11. The method of claim 10, wherein performing said at least one process operation comprises:
performing a first deposition process to deposit a layer of high-k insulating material on an upper surface of said substrate, on a bottom surface of said patterned upper sacrificial gate electrode and on sidewalls of said trenches;
performing a second deposition process to deposit at least one work-function adjusting material layer on said high-k insulating material; and
performing at least one third etching process to remove portions of said high-k gate insulation layer and said at least one work-function adjusting material layer so as to define at least a lower portion of said replacement gate structure that is at least partially positioned within said first portion of said replacement gate cavity.

12. The method of claim 11, further comprising:
after performing said at least one third etching process, performing at least one fourth etching process to remove said patterned upper sacrificial gate electrode so as to expose portions of said high-k gate insulation layer that were positioned under said patterned upper sacrificial gate electrode;
after performing said at least one fourth etching process, performing a fifth etching process to remove said exposed portions of said high-k gate insulation layer so as to expose an upper surface of said work-function adjusting material layer of said lower portion of said replacement gate structure; and
forming at least one layer of conductive material above said exposed upper surface of said lower portion of said replacement gate structure, wherein a final replacement gate structure for a transistor device is comprised of at least said lower replacement gate structure and said at least one layer of conductive material.

13. The method of claim 10, wherein said upper sacrificial gate electrode is comprised of silicon, amorphous silicon or polysilicon, and said lower sacrificial gate electrode is comprised of silicon-germanium.

14. A method, comprising:
forming a sacrificial gate structure above a surface of a semiconductor substrate, wherein forming said sacrificial gate structure comprises:
forming a sacrificial gate insulation layer above said surface of said semiconductor substrate;

forming a lower sacrificial gate electrode comprising one of silicon, amorphous silicon and polysilicon above said sacrificial gate insulation layer; and forming an upper sacrificial gate electrode comprising silicon-germanium above said lower sacrificial gate electrode;

forming a sidewall spacer adjacent opposite sides of at least said lower sacrificial gate electrode and said upper sacrificial gate electrode;

forming a layer of insulating material adjacent said sidewall spacers;

forming a plurality of trenches in said upper sacrificial gate electrode so as to form a patterned upper sacrificial gate electrode, each of said plurality of trenches exposing an upper surface portion of said lower sacrificial gate electrode;

performing at least one etching process through said patterned upper sacrificial gate electrode to remove said lower sacrificial gate electrode and said sacrificial gate insulation layer from said sacrificial gate structure and to form a first portion of a replacement gate cavity that is at least partially defined by a bottom surface of said patterned upper sacrificial gate electrode and inner sidewall surfaces of said sidewall spacer;

forming a layer of high-k gate insulation material inside of said first portion of said replacement gate cavity through said patterned upper sacrificial gate electrode; and forming at least one work-function adjusting material layer inside of said cavity and on said layer of high-k gate insulation material through said patterned upper sacrificial gate electrode.

15. The method of claim 14, further comprising removing said patterned upper sacrificial gate electrode and forming a layer of conductive material above said at least one work-function adjusting material layer.

16. The method of claim 15, further comprising forming a dielectric gate cap layer above said layer of conductive material.

* * * * *